United States Patent [19]

Mashimo et al.

[11] 4,064,515

[45] Dec. 20, 1977

[54] ANALOG TO DIGITAL CONVERTER FOR A PLURALITY OF ANALOG CHANNELS

[75] Inventors: Yukio Mashimo, Tokyo; Nobuaki Sakurada, Yokohama; Tadashi Ito, Yokohama; Fumio Ito; Nobuhiko Shinoda; Hiroyashu Murakami, both of Tokyo, all of Japan

[73] Assignee: Canon Kabushiki Kaisha, Tokyo, Japan

[21] Appl. No.: 604,532

[22] Filed: Aug. 14, 1975

[30] Foreign Application Priority Data

Aug. 30, 1974 Japan .................................. 49-99687

[51] Int. Cl.² ............................................. G03B 7/08
[52] U.S. Cl. ................................ 354/23 D; 354/37; 354/38; 340/347 AD
[58] Field of Search ................ 340/347 AD, 347 NT; 324/99 D; 354/23 D, 60, 60 A, 24

[56] References Cited

U.S. PATENT DOCUMENTS

| 3,276,012 | 9/1966 | Secretan | 340/347 AD |
|---|---|---|---|
| 3,742,826 | 7/1973 | Kohtani | 354/23 D |
| 3,824,608 | 7/1974 | Toyoda | 354/60 A X |
| 3,843,249 | 10/1974 | Kitaura | 354/60 |
| 3,863,263 | 1/1975 | Itagaki | 354/24 |
| 3,872,483 | 3/1975 | Numata et al. | 354/23 D |
| 3,899,788 | 8/1975 | Toyoda | 354/23 D |
| 3,900,844 | 8/1975 | Wald | 340/347 C |
| 3,900,855 | 8/1975 | Stempeck | 354/23 D X |
| 3,909,137 | 9/1975 | Kisanuki | 354/23 D X |
| 3,921,183 | 11/1975 | Toyoda | 354/23 D |
| 3,988,069 | 10/1976 | Kitaura | 340/347 AD |

OTHER PUBLICATIONS

Susskind, Notes on Analog-Digital Conversion Techniques, 1957, The Technology Press, MIT, pp. 5-2 to 5-14.

Primary Examiner—Thomas J. Sloyan
Attorney, Agent, or Firm—Toren, McGeady and Stanger

[57] ABSTRACT

A number of separate comparators compare respective analog inputs to a single reference waveform and turn off respective gates when the analog voltages achieve predetermined relationships to reference wave form. The gates pass pulses from a common source from the beginning of the reference wave form until the respective gates are shut off. In one version the analog signals represent photographic data such as diaphragm aperture and shutter speed in a camera, and are digitized for display within the camera.

1 Claim, 10 Drawing Figures

ANALOG TO DIGITAL CONVERTER FOR A PLURALITY OF ANALOG CHANNELS

BACKGROUND OF THE INVENTION

1. Field of the Invention

The present invention relates to an analog-digital converting device for converting analog quantities into digital quantities, especially to an analog digital converting device for converting many analog inputs into digital quantities at one time.

2. Description of the Prior Art

In known A-D converters which convert analog quantities into digital quantities, a comparator receives each analog voltage along with reference signals from separate reference generating means and compares the analog quantities to the reference values while separate pulse generators pass pulse signals through separate gates. When the reference values equal the analog values the comparators turn off the gates. The analog quantities are then represented by the number of pulses passing through the gates.

In order to convert a number of analog quantities into digital quantities by means of such devices, the number of reference signal sources as well as pulse sources must correspond with the number of analog quantities to be converted. It is also essential that the characteristics of the reference signal sources be identical, and that the pulse sources be identical. This results in space consuming and expensive converters.

SUMMARY OF THE PRESENT INVENTION

The purpose of the present invention is to offer an A-D converting device for multi-input.

Another purpose of the present invention is to offer an A-D converting device which converts the analog quantities of multi-input into digital quantities by means of a single reference signal generating means.

Further, another purpose of the present invention is to offer an A-D converting device for multi-input so designed that the analog quantities to be converted are respectively put in the one input terminal of the corresponding one of a plural number of the comparison circuits while the reference signal generating means are respectively connected with other corresponding input terminal.

Further, another purpose of the present invention is to offer an A-D converting device for a camera composed of either one of the above mentioned A-D converting device, for converting a plural number of the analog quantities representing exposure factors such as the measured light amount, the film sensitivity information and so on into digital quantities at one time.

Further other purposes of the present invention will be disclosed from the following explanation to be made in accordance with the accompanying drawings.

DESCRIPTION OF THE EMBODIMENTS OF THE INVENTION

Figure 1:
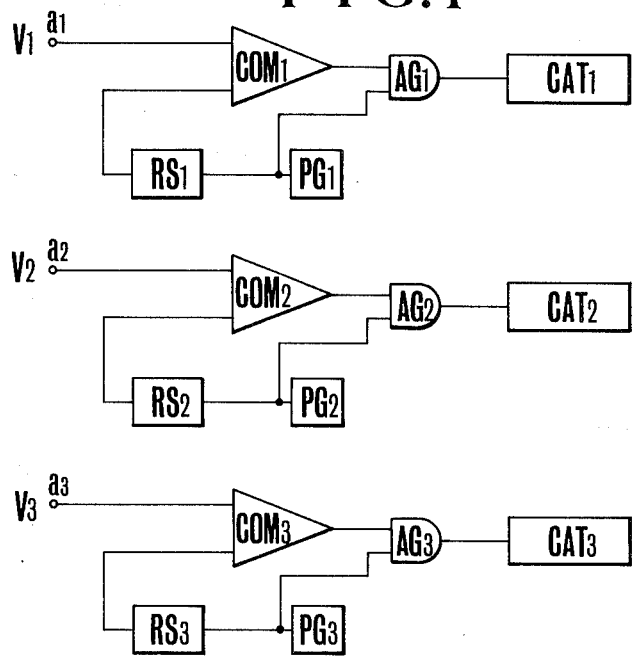
FIG. 1 shows a circuit diagram of an embodiment of an analog-digital converting system which converts a plural number of the analog quantities into digital quantities at one time, making use of conventional A-D converters.

FIG. 1 shows a circuit diagram of an analog-digital converting system which converts a plural number of the analog quantities into digital quantities by making use of conventional A-D converters. Comparators $com_1$, $com_2$ and $com_3$ each has one input terminal $a_1$, $a_2$ and $a_3$ receiving respective analog voltages of each comparator, the voltage $V_1$, $V_2$ and $V_3$. Each of pulse generating circuits $PG_1$, $PG_2$ and $PG_3$ produces pulses at a predetermined period. The output terminal of each pulse generating circuit is connected with one of the reference signal generating means $RS_1$, $RS_2$ and $RS_3$ each of the latter produces an analog voltage in accordance with the number of pulses generated by the respective pulse generating circuit. The circuits $PG_1$, $PG_2$, and $PG_3$ are also connected with one iput terminal of the AND-gate $AG_1$, $AG_2$ and $AG_3$ whose other input terminal is connected with the respective output terminals of the comparators $com_1$, $com_2$ and $com_3$. The output terminals of the reference signal generating means $RS_1$, $RS_2$ and $RS_3$ are respectively connected with the input terminals of the corresponding comparators $com_1$, $com_2$ and $com_3$. Converters $CAT_1$, $CAT_2$ and $CAT_3$ are respectively connected with the corresponding output terminals of the AND-gates $AG_1$, $AG_2$ and $AG_3$.

In operation a starting switch not shown in the drawing, is closed. The pulse generating circuits $PG_1$, $PG_2$ and $PG_3$ are brought into operation at the same time so as to produce respectively the pulse signals at a certain same period. These pulse signals are conveyed to respective reference signal generating means $RS_1$, $RS_2$ and $RS_3$ to be converted into the voltages corresponding to the numbers of the corresponding pulse signals. These voltages are respectively compared with voltages $V_1$, $V_2$ and $V_3$ by means of the comparators $com_1$, $com_2$ and $com_3$. When both voltages are identical with each other $com_1$, $com_2$ and $com_3$ produce logical zeros so as to close the AND-gate $AG_1$, $AG_2$ and $AG_3$. On the other hand, the pulse signals generated by means of the pulse generating circuits $PG_1$, $PG_2$ and $PG_3$ are counted by means of the counters $CAT_1$, $CAT_2$ and $CAT_3$ through the AND-gates $AG_1$, $AG_2$ and $AG_3$ until the comparators produce logical zeros. Thus $V_1$, $V_2$ and $V_3$ are converted from the analog quantities into digital quantities.

In the case mentioned above, a plural number of the analog quantities are converted into digital quantities by means of conventional A-D converters. Thus it is essential provide the same number of the reference signal generating means as that of the analog quantities to be converted. This causes difficulties in the construction of the circuit and its precision.

Figure 2:
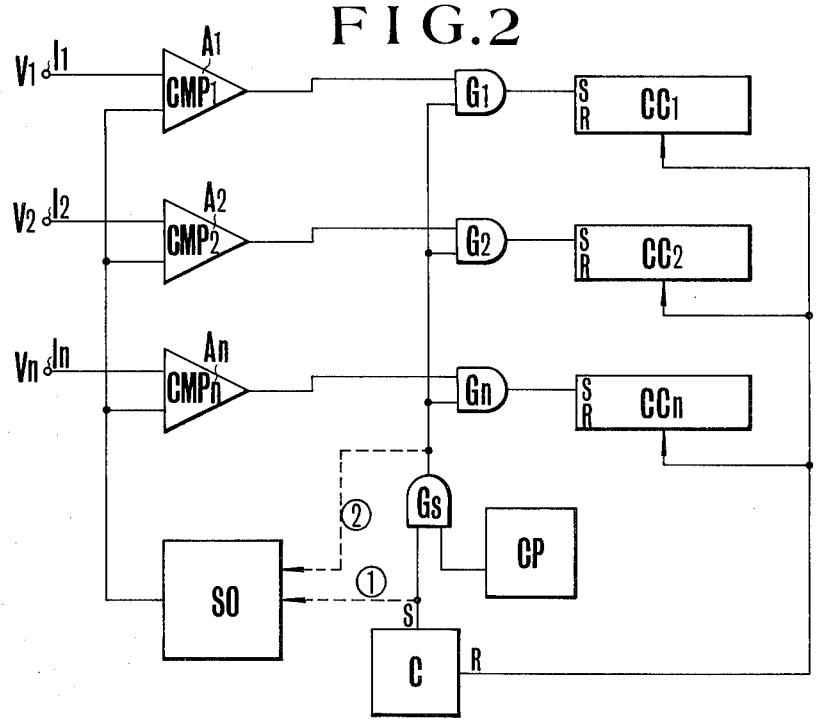
FIG. 2 shows a circuit system diagram for showing the basic composition of the A—A converter in accordance with the present invention.

FIG. 2 shows a circuit diagram of an embodiment of an A-D converter which converts a plurality of analog inputs in accordance with the present invention, and which eliminates the shortcomings of the above mentioned conventional A-D converter.

The respective input terminals $I_1$, $I_2$ and $I_n$ receive analog signals $V_1$, $V_2$ and $V_n$. Amplifiers $A_1$, $A_2$ and $A_n$ function as respective comparators. Members $G_1$, $G_2$, $G_n$ and $G_s$ are AND-gates and $CC_1$, $CC_2$ and $CC_n$ pulse counters or registers. Reference signal generating means so produce step-shaped or saw-tooth shaped voltages corresponding to the number of the pulses produced by the clock pulse generating means CP. The control signal generating circuit C produces the starting signal, the reset signal, etc. Reference character S represents the starting pulse while R represents the reset pulse.

Figure 3:
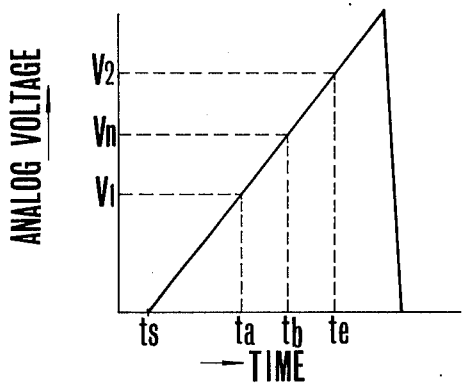
FIG. 3 shows a diagram for explaining the operation of the device shown in FIG. 2.

FIG. 3 shows the diagram for explaining the operation of the device shown in FIG. 2.

Below the operation of the embodiment shown in FIG. 2 will be explained.

After actuating the control signal generating means C, the starting signal S is applied to the reference signal generating means SO and to the AND-gate $G_s$ while the clock pulse generating means CP is actuated. When the starting signal S is applied to the reference signal generating means SO, the reference signal generating means SO produces a saw-tooth shaped voltage as is shown in FIG. 3, which voltage is put in the input terminals of $A_1$, $A_2$ and $A_3$. On the other hand, the pulse generated by the clock pulse generating means CP is put in the input terminals of $G_1$, $G_2$ and $G_3$ through the AND-gate $G_2$. The outputs of the comparators $A_1$, $A_2$ and $A_3$ assume a logical "1" until a coincidence signal is produced. Hence the clock pulse generated by means of CP passes through gates $G_1$, $G_2$ and $G_3$ to the input of the registers $CC_1$, $CC_2$ and $CC_n$, which count the number of the respective pulses. Then after elapse of the time $t_a$, the analog voltage at the input terminal equals the output voltage coming from SO, and the comparator $A_1$ produces a logical "0". By means of this, the AND-gate $G_1$ is closed and the counting operation of the register $CC_1$ is stopped. Therefore that the number of the pulses produced by means CP from the time $t_s$ up to $t_a$ is stored in the register $CC_1$. Thus the analog voltage $V_1$ is coded into a pulse number and stored in $CC_1$.

At the time $t_b$, $A_n$ produces an output "0" so as to open the AND-gate $G_n$ so that the counting operation of the register stops. Now the input $V_a$ is stored by means of $CC_1$ as digital signal. In a similar way, the analog signal $V_c$ is coded into a digital value and stored in register $CC_2$. During one cycle of the saw-tooth shaped wave produced by the reference signal generating means the analog input signals $V_1 - V_n$ are connected into digital data as explained above. The reference signal generating means so produces a step-shaped voltage corresponding to the number of the clock pulses applied to SO, after having passed through the AND-gate $G_s$ along as is the dotted line (2). A-D conversion is performed in the same way as in the above mentioned saw-tooth shaped wave.

Figure 4A:
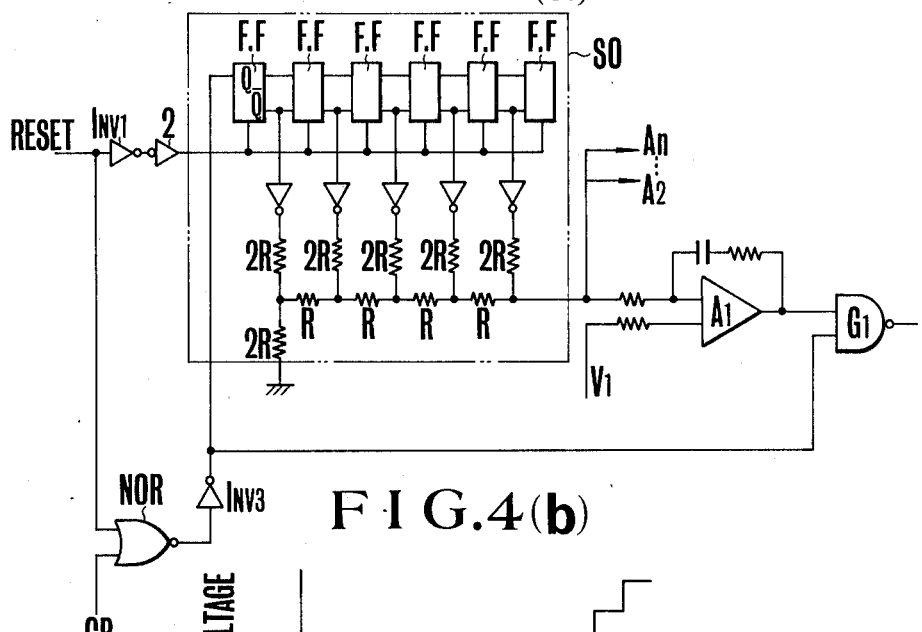
FIG. 4(a) shows a circuit diagram of an embodiment of the reference signal generating means in the A-D converter in accordance with the present invention.
Figure 4B:
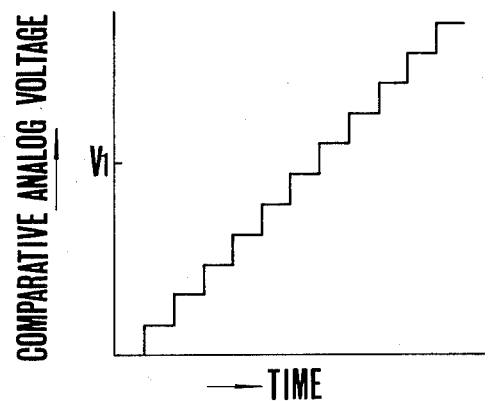
FIG. 4(b) shows a diagram of the output characteristics of the reference signal generating means shown in FIG. 4(a).

The reference signal generating means SO utilizes the Flip-Flap counters FF and the rudder circuit as is shown in FIG. 4(a). The output voltage alters the shape of the step according to the elapse of the time as is shown in FIG. 4(b). As shown in the drawing, the output of SO is delivered to the comparators $A_1$, $A_2$ and $A_n$ so as to be compared corresponding analog inputs. The clock pulses coming from CP trigger the counter of SO through the NOR-gate and inverter $INV_3$ and are further counted through the NAND-gate $G_1$ until the coincidence signal is produced. Further the reset pulse is applied to the reset terminal of the counter through the inverter $INV_1$.

Figure 5:
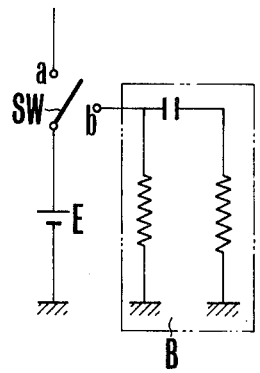
FIG. 5 shows a circuit diagram of an embodiment of the control signal generating circuit shown in FIG. 2.

Further, the control signal generating circuit C is composed of of a current source E, a differentiating circuit and the switchingover switch as is shown in FIG. 5. In order to obtain a starting signal the switch SW is connected to a contact $a$, while in order to obtain a reset signal the switch SW is connected to a contact $b$.

Figure 6:
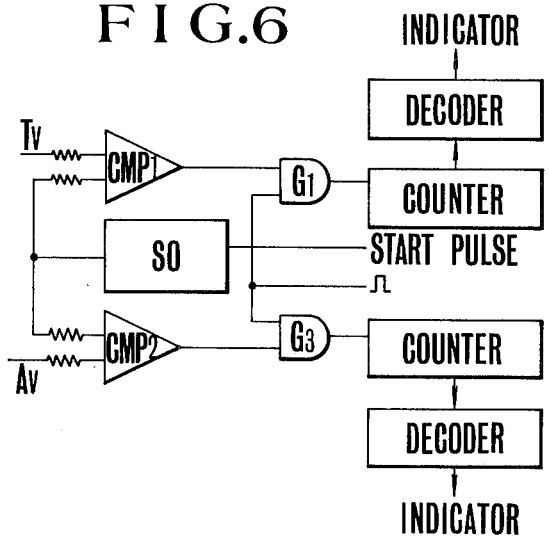
FIG. 6 shows a circuit diagram of an embodiment of the multi-input A-D converter in accordance with the present invention applied in the indication circuit of the camera.
Figure 6:
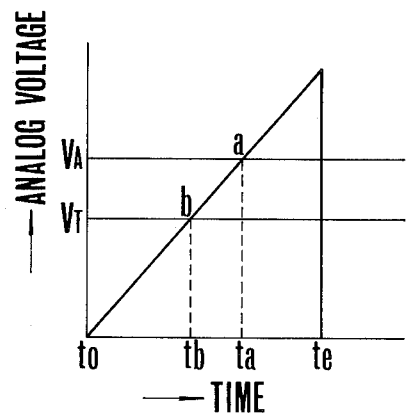

FIG. 6 shows an embodiment of the A-D converter for multi-inputs in accordance with the present invention applied in the indication circuit of a camera, wherein CO is shown as the one which produces saw-tooth shaped wave.

Analog input signals corresponding the shutter time information Tv and the aperture information are applied to the comparator $CMP_1$ and $CMP_2$. They are converted into digital values during one cycle of the output of the saw-tooth shaped wave generating means CO and stored in the counter in such a manner that the digital informations are decoded by the decoder and indicated by means of the digital indication means in the view finder or the like.

Figure 7:
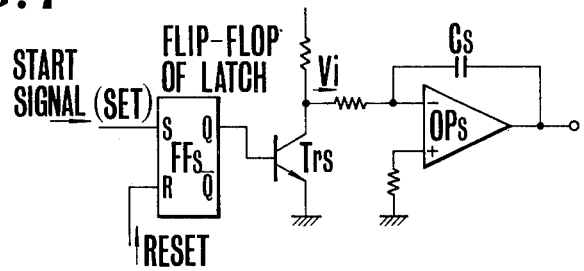
FIG. 7 shows a circuit diagram of another embodiment of the control signal generating circuit shown in FIG. 2.

FIG. 7 shows a circuit diagram of an embodiment of the saw-tooth shaped wave generating means shown in FIG. 6. Here $FF_s$ is a Flip-Flap whose set terminal S receives the starting signal from the above mentioned control signal generating circuit C, so as to procuce an output at the output terminal. Member Trs is a transister provided at the output terminal of $FF_s$, $OP_s$ an operational amplifier and Cs a capacitor which forms a Miller integrating circuit together with the above mentioned $OP_s$ so as to produce a saw tooth shaped voltage at its output terminal. The Miller integrator is actuated when the above mentioned transister Trs is switched on.

Figure 8:
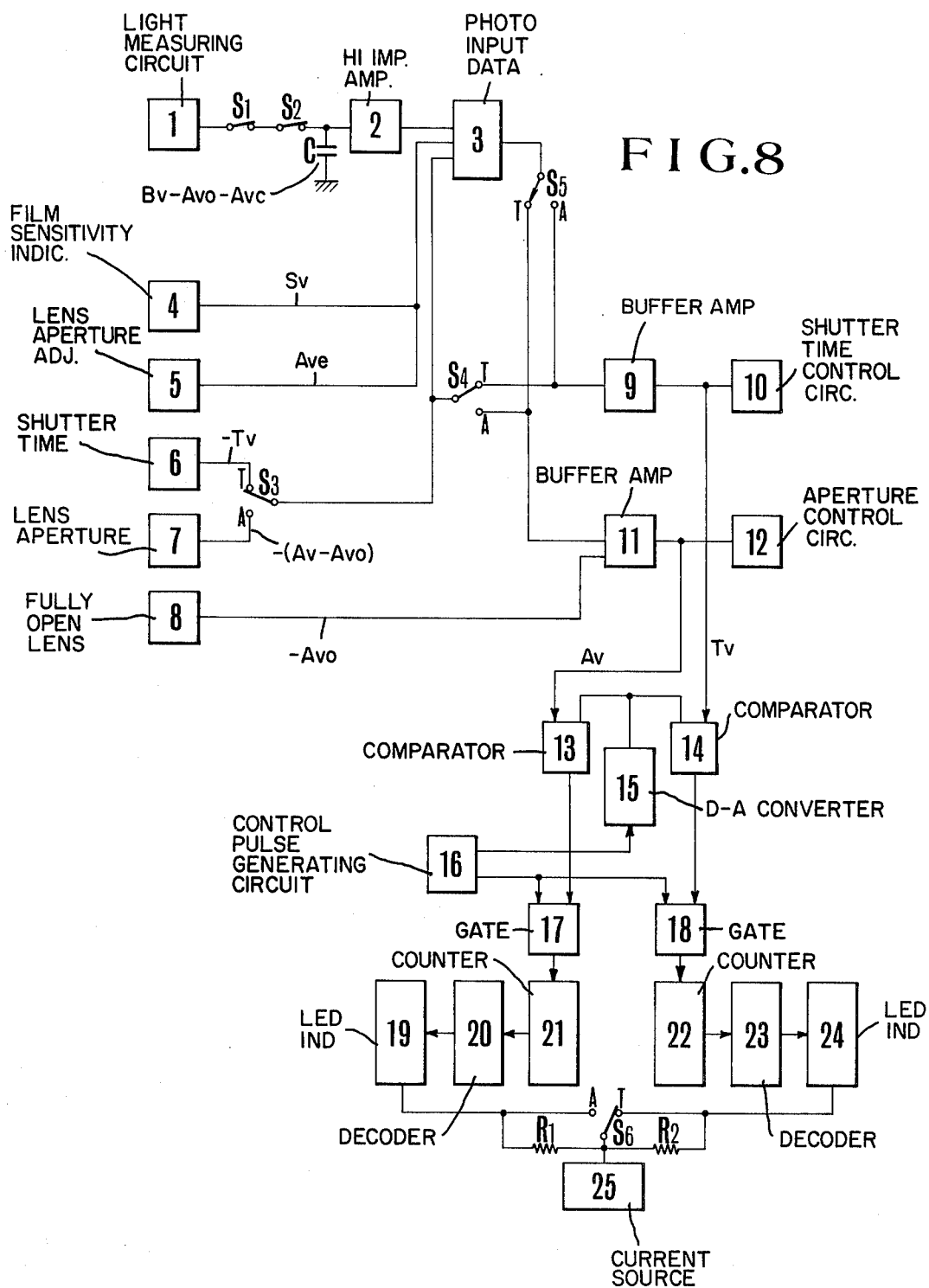
FIG. 8 shows a block diagram of an embodiment of the A-D converter in accordance with the present invention applied for a camera.

FIG. 8 shows a circuit system diagram of an embodiment of the A-D converting device in accordance with the present invention applied in a camera. In the diagram 1 is a light measuring circuit, $S_1$ a storage switch, $S_2$ a temporary storage switch (EE lock) and C the storage condenser. 2 is an amplifier with high input impedance, for example FET. An analog processing circuit 3 produces analog information (shutter time information or aperture information) at its output out of various kinds of photographic input data. Members 4 to 8 supply various forms of photographic data, whereby for example, 4 furnishes the film sensitivity Sv, 5 the lens aperture adjusting information Ave, 6 the shutter time information -Tv, 7 the aperture information -(Av - Avo) and 8 the aperture value of the totally opened lens -Avo. Members $S_3$, $S_4$, $S_5$ and $S_6$ are mechanically linked selector switches for selecting operation with priority on shutter selection or that with priority on aperture selection. Members 9 and 11 are buffer amplifier, 10 a shutter time control circuit, 12 an aperture control circuit, 13, 14 the comparators, 15 the D-A converter, 16 the control pulse generating circuit, 17, 18 the gate circuits, 19, 20, 21 and 22, 23 and 24 respective LED indication devices, a decoder and a counter, and 25 the current source.

When the light measuring circuit operates as part of a totally opened TTL light measurement as shown in the drawing, the light sensing element 1 receives the light beam $Bv - Avo - Avc$. Here $Bv$ is the Apex-value of the object to be photographed, $Avo$ the Apex-value of the totally opened F value and $Avc$ the Apex-value for the aperture adjustment. Realease of the shutter button opens the storage switch $S_1$ before the mirror is lifted. This stores the signal of the output $Bv - Avo - Avc$ of the light sensing element in the condenser C. In the operating mode with priority on the shutter the switches $S_3$, $S_4$ and $S_5$ are moved to the position shown in the drawing (connected to the side T). The processing circuit 3 receives the value $Bv - Avo - Avc$ stored in C through the amplifier 2, and $Sv$, $Avc$ and $-Tv$ from the information sources 4 to 6. Hereby $Sv$ is the Apex-value of the film sensitivity and $Tv$ the Apex-value of the shutter time. Thus these analog Apex-values are processed in the processing circuit in such a manner that the inversed output $-(Av - Avo)$ of $(Bv - Avo - Avc) + Sv - Tv + Avc = Av - Avo$ (inverted by 3) is put in the buffer-amplifier 11 through $S_5$, in which the inverted process $(Av)$ of the output of the $Avc$ information source 8 and $-(Av - Avc) = -Av$ is carried out in such a manner that at the output of 11 $Av$ namely the Apex-value of the aperture is produced. This $Av$ analog information is applied to the comparator 13. Further, from the $Tv$ information source 6 its output $-Tv$ applied to in the buffer amplifier 9 through switches $S_3$ and $S_4$, inversed by the buffer amplifier 9 so the value that $Tv$ is applied to the comparator 14. The pulses from the clock pulse generating means are applied to the D-A converter 15, whose output signal is put in 13 and 14, so as to be compared with the analog signals of $Av$ and $Tv$. The counters 21 and 22 continue to count the clock pulses through the AND-gates 17 and 18 until the comparaters 13 and 14 produce a coincidence signal in such a manner that the digital informations corresponding to the analog signals of $Av$ and $Tv$ are set respectively in 21 and 22. The prolongation of the Apex-value into the actual value is carried out by means of the decoders 20 and 23 in such a manner that the shutter time is indicated in the LED indication means 19 and 24. The shutter time control circuit 10 and the aperture control circuit 12 respectively control the shutter curtain and the diaphragm blade in the conventional way respectively by means of the input signals $Tv$ and $Av$ so as to obtain a proper exposure.

In aperture priority mode the switches $S_3$, $S_4$ and $S_5$ shown in the drawing are connected to the contacts A. Hence the shutter time and the aperture are indicated in the same way as in the above mentioned case, while the shutter time and the aperture are controlled in the same way as above. Specifically, in the processing circuit 3, the information $Bv - Avo - Avc$ from the light sensing element 1, the film information $Sv$ from 4, the Apex-value $Avc$ for aperture adjustment from 5 and the aperture information $-(Av - Avc)$ from 7 are put, the inversed output $-Tv$ of $(Bv - Avo - Avc) + Sv + Avc - (Av - Avo) = Tv$ is applied to the buffer circuit 9 through the switch $S_5$ so as to be inversed in the circuit 9 in such a manner that $Tv$ (analog value) is applied to the comparator. On the other hand, the output $-(Avo - Avc)$ from 7 and that $-Avo$ from 8 are put in the buffer-circuit 11, so as to produce $Av$ as the output of the circuit 11. The value $Av$ is transferred to the comparator 13 and then converted into digital value in the same way as in case of the mode with shutter priority in such a manner that the shutter time and the aperture value are indicated digitally. The switch $S_6$ is mechanically linked with the switches $S_3 - S_5$ so as to indicate in the view finder whether the priority is on the shutter time or on the aperture, whereby the indication means 19 and 24 are supplied with current from the current source through the switch $S_6$ and the resistances $R_1$ and $R_2$. With shutter priority the $S_6$ is located as is shown in the drawing, the brightness of $LED_{24}$ for indicating the shutter time is higher than the $LED_{19}$ for indicating the aperture. This, which indicates that the mode is with priority on shutter time. In case of the mode with priority on aperture the switch $S_6$ is connected to the side "A", whereby the brightness of $LED_{19}$ is higher than that of $LED_{24}$. This indicates that the aperture priority mode.

Figure 9:
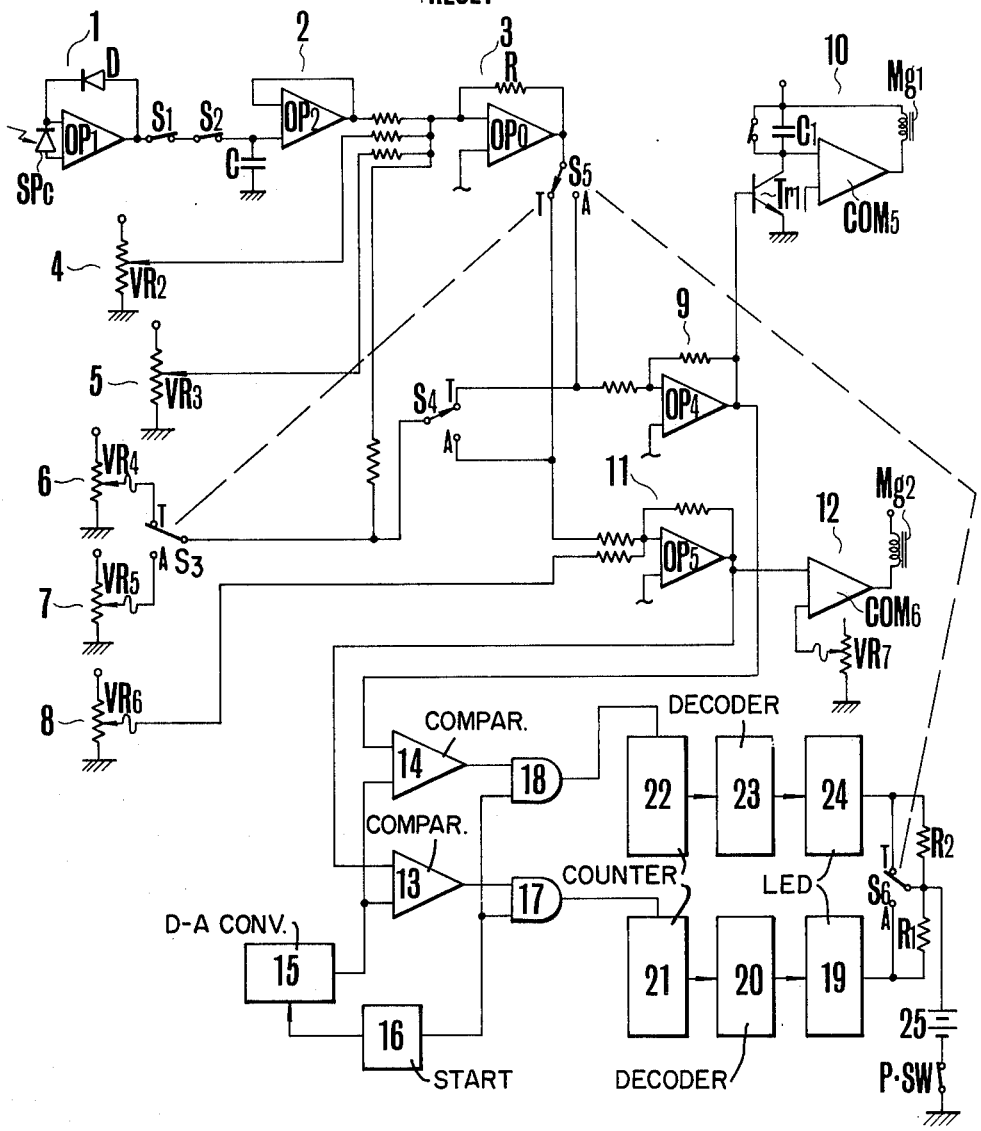
FIG. 9 shows a circuit diagram for showing a concrete composition of the block diagram shown in FIG. 8.

FIG. 9 shows circuit of the block diagram shown in FIG. 8, wherein the same elements are identified by the same reference characters.

Below the composition of each block in FIG. 9 is explained in accordance with FIG. 9. The light measuring circuit 1 consists of a photovoltaic element SPC for receiving the light beam coming through the photographic lenses (not shown in the drawing), the operation amplifier $OP_1$ whose input terminals are connected with both terminals of the SPC, and the diode D connected between the input terminal and the output terminal in such a manner that the incident light beam is compressed logarithmically. The amplifier 2 is composed of an operational amplifier $OP_2$, while the processing means 3 is conposed of of an operational amplifier $OP_3$ between whose input terminal and output terminal a resistance $R_1$ is connected. Hence the data are respectively set by the value of the resistances $VR_2 - VR_6$. The shutter time control circuit 10 composed of a time constant circuit having a condenser C and of a transistor $Tr_1$ whose base is connected with the output terminal of the amplifier $OP_4$, of a comparator $com_5$ connected with the time constant circuit and of a magnet connected with the output of the comparator. The aperture control circuit 12 is composed of a comparator 6 whose one input terminal is connected with the output terminal of the amplifier $OP_5$. It is also composed of a variable resistance $VR_7$ which is connected with the other input terminal of the comparator 6 and whose resistance value varies in accordance with the aperture value, and of a magnet $Mg_1$ connected with the output terminal of the comparator $com_6$, so as to hold the preset ring (not shown in the drawing). The operation of the embodiment shown in FIG. 9 is same as that in FIG. 8.

As explained above in detail in the A-D converting means for multi-inputs in accordance with the present invention the one input terminals of each of a plural number of the comparator is connected with a common reference signal generating means so that a simple structure permits simultaneous conversion the analog quantities of many inputs into digital quantities. A single reference signal generating means is sufficient. Thus a even a low precision reference signal generating means can produce high precision A-D conversion. This contrasts with the conventional A-D converting means in which all the reference signal generating means have to possess the same characteristics, while the tolerances have has to be considerably smaller. The A-D converting means in accordance with the present invention can be said to be extremely effective for small appliances such as camera.

What is claimed is:

1. For a camera having a shutter and a diaphragm, a system for generating digital photographic information, comprising:
    a. a light measuring circuit for sensing the brightness of an object and forming an analog output corresponding to said brightness,
    b. an exposure factor setting means to set exposure factor information,
    c. an exposure factor signal forming circuit coupled to said setting means to form an analog output corresponding to the exposure factor value being set by the exposure factor setting means,
    d. an exposure computation circuit coupled to said light measuring circuit and to said exposure factor signal forming circuit to form an analog output corresponding to the object brightness based on the output of said light measuring circuit and the exposure factor information being set by said exposure factor setting means,
    e. a pulse generating means,
    f. a single reference signal generating means for forming an analog reference signal corresponding to the number of pulses generated by means of said pulse generating means,
    g. a first comparison circuit having one input terminal connected to the output terminal of said reference signal generating means and another input terminal connected to the output terminal of said exposure computation circuit, so as to generate an output when both input values have a prescribed relationship,
    h. a second comparison circuit having an input terminal connected to the output terminal of said reference signal generating means and another input terminal connected to said exposure factor signal forming circuit so as to generate an output when said both input values have a prescribed relationship,
    i. a first gate means connected to said pulse generating means and the output terminal of said first comparison circuit and turned off in response to the output of said first comparison circuit,
    j. a second gate means connected to said pulse generating means and the output terminal of said second comparison circuit and turned off in response to the output of said second comparison circuit,
    k. a first counter means connected to said first gate means,
    l. a second counter means connected to said second gate means,
    m. a first indication means connected to said first counter means to indicate the content of said counter, and
    n. a second indication means connected to said second counter means to indicate the content of said counter,
    said exposure factor setting means including a shutter time information setting means and a diaphragm aperture information setting means and a mode selection means for selecting a shutter preference mode and a diaphragm preference mode for introducing the shutter time into said exposure computation circuit when the shutter preference mode is selected and for introducing diaphragm data into said exposure computation circuit when the diaphragm aperture preference mode is selected, said exposure factor setting means forming an analog output corresponding to shutter time information when the shutter preference mode is selected and exposure factor forming means forming an analog output corresponding to the diaphragm aperture when the diaphragm preference mode is selected.

* * * * *